(12) United States Patent
Chidambarrao et al.

(10) Patent No.: US 6,890,808 B2
(45) Date of Patent: May 10, 2005

(54) METHOD AND STRUCTURE FOR IMPROVED MOSFETS USING POLY/SILICIDE GATE HEIGHT CONTROL

(75) Inventors: Dureseti Chidambarrao, Weston, CT (US); Omer H. Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,135

(22) Filed: Sep. 10, 2003

(65) Prior Publication Data

US 2005/0054148 A1 Mar. 10, 2005

(51) Int. Cl.$^7$ .......................................... H01L 21/8238
(52) U.S. Cl. ....................................... 438/199; 438/630
(58) Field of Search ............................... 438/199, 202, 438/205, 581, 630

(56) References Cited

U.S. PATENT DOCUMENTS

| | | |
|---|---|---|
| 3,602,841 A | 8/1971 | McGroddy |
| 4,665,415 A | 5/1987 | Esaki et al. |
| 4,853,076 A | 8/1989 | Tsaur et al. |
| 4,855,245 A | 8/1989 | Neppl et al. |
| 4,952,524 A | 8/1990 | Lee et al. |

(Continued)

OTHER PUBLICATIONS

Novel Locally Strained Channel Technique for High Performance 55nm CMOS K. Ota, et al. 2002 IEEE, 2.2.1–2.2.4, IEDM 27.
Local Mechanical–Stress Control (LMC): A New Technique for CMOS—Performance Enchancement A. Shimizu, et al. 2001 IEEE, 19.4.1–19.4.4, IEDM 01–433.
Mechanical Stress Effect of Etch–Stop Nitride and its Impact on Deep Submicron Transistor Design Shinya Ito, et al. 2000 IEEE, 10.7.1–10,7.4, IEDM 00–247.
A Highly Dense, High–Performance 130nm node CMOS Technology for Large Scale System –on–a– Chip Applications F. Ootsuka, et al. 2000 IEEE, 23.5.1–23.5.4, IEDM 00–575.
NMOS Drive Current Reduction Caused by Transistor–Layout and Trench Isolation Induced Stress Gregory Scott, et al. 1999 IEEE, 34.4.1–34.4.4, IEDM 99–827.
Transconductance Enhancement in Deep Submicron Strained–Si n– MOSFETs Kern (Ken) Rim, et al. 1998 IEEE, 26.8.1–26.8.4, IEDM 98–707.
Characteristics and Device Design of Sub–100 nm Strained Si N– and PMOSFET's K. Rim, et al. 2002 IEEE, 98–99, 2002 Symposium On VLSI Technology Digest of Technical Papers.

*Primary Examiner*—Evan Pert
*Assistant Examiner*—Asok Kumar Sarkar
(74) *Attorney, Agent, or Firm*—McGuireWoods LLP; Joseph P. Abate (57) ABSTRACT

A method for manufacturing an integrated circuit that has a plurality of semiconductor devices including an n-type field effect transistor and a p-type field effect transistor. This method involves depositing oxide fill on the n-type transistor and the p-type transistor and chemical/mechanical polishing the deposited oxide fill such that a gate stack of the n-type transistor and a gate stack of the p-type transistor, which each have spacers which are surrounded with oxide. The method further involves etching a portion of the polysilicon from a gate of the p-type field effect transistor, depositing a low resistance material (e.g., Co, Ni, Ti, or other similar metals) on the n-type field effect transistor and the p-type field effect transistor, and heating the integrated circuit such that the deposited material reacts with the polysilicon of the n-type transistor and the polysilicon of the p-type transistor to form silicide. The silicide formed on the p-type polysilicon imposes compressive mechanical stresses along the longitudinal direction of the p-type field effect transistor. A semi-conductor device formed by this method has compressive stresses along the length of the PFET channel and tensile stresses along the length of the NFET channel.

14 Claims, 6 Drawing Sheets

U.S. PATENT DOCUMENTS

| | | | |
|---|---|---|---|
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,677,232 A * | 10/1997 | Kim et al. | 438/412 |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,736 A | 8/1999 | Brady et al. | |
| 5,946,559 A | 8/1999 | Leedy | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,274,444 B1 | 8/2001 | Wang | |
| 6,281,532 B1 | 8/2001 | Doyle et al. | |
| 6,284,626 B1 | 9/2001 | Kim | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,975 B1 | 6/2002 | Brunner et al. | |
| 6,406,973 B1 | 6/2002 | Lee | |
| 6,476,462 B2 | 11/2002 | Shimizu et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,512,273 B1 * | 1/2003 | Krivokapic et al. | 438/199 |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,573,172 B1 * | 6/2003 | En et al. | 438/626 |
| 2002/0074598 A1 | 6/2002 | Doyle et al. | |
| 2002/0086472 A1 | 7/2002 | Roberds et al. | |
| 2002/0090791 A1 | 7/2002 | Doyle et al. | |
| 2003/0040158 A1 | 2/2003 | Saitoh | |

* cited by examiner

METHOD AND STRUCTURE FOR IMPROVED MOSFETS USING POLY/SILICIDE GATE HEIGHT CONTROL

BACKGROUND OF INVENTION

The invention generally relates to methods for manufacturing a semiconductor device with improved device performance, and more particularly to methods for manufacturing semiconductor devices which impose tensile and compressive stresses in the substrate of the device during device fabrication.

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type devices (e.g., NFETs) and/or p-type devices (e.g., PFETs). However, the same stress component, either tensile stress or compressive stress, discriminatively affects the characteristics of an n-type device and a p-type device.

In order to maximize the performance of both NFETs and PFETs within integrated circuit (IC) chips, the stress components should be engineered and applied differently for NFETs and PFETs. That is, because the type of stress which is beneficial for the performance of an NFET is generally disadvantageous for the performance of the PFET. More particularly, when a device is in tension (in the direction of current flow in a planar device), the performance characteristics of the NFET are enhanced while the performance characteristics of the PFET are diminished. To selectively create tensile stress in an NFET and compressive stress in a PFET, distinctive processes and different combinations of materials are used.

For example, a trench isolation structure has been proposed for forming the appropriate stresses in the NFETs and PFETs, respectively. When this method is used, the isolation region for the NFET device contain a first isolation material which applies a first type of mechanical stress on the NFET device in a longitudinal direction (parallel to the direction of current flow) and in a transverse direction (perpendicular to the direction of current flow). Further, a first isolation region and a second isolation region are provided for the PFET and each of the isolation regions of the PFET device applies a unique mechanical stress on the PFET device in the transverse and longitudinal directions.

Alternatively, liners on gate sidewalls have been proposed to selectively induce the appropriate strain in the channels of the FET devices (see Ootsuka et al., IEDM 2000, p.575, for example). By providing liners the appropriate stress is applied closer to the device than the stress applied as a result of the trench isolation fill technique.

While these methods do provide structures that have tensile stresses being applied to the NFET device and compressive stresses being applied along the longitudinal direction of the PFET device, they may require additional materials and/or more complex processing, and thus, resulting in higher cost. Further, the level of stress that can be applied in these situations is typically moderate (i.e., on the order of 100s of MPa). Thus, it is desired to provide more cost-effective and simplified methods for creating large tensile and compressive stresses in the channels NFETs and PFETs, respectively.

SUMMARY OF INVENTION

In a first aspect, this invention provides a method for manufacturing an integrated circuit comprising a plurality of semiconductor devices including an n-type transistor and a p-type transistor. The method involves depositing oxide fill on the n-type transistor and the p-type transistor and chemical/mechanical polishing the deposited oxide fill such that a gate stack of the n-type transistor and a gate stack of the p-type transistor, the n-type transistor and the p-type transistor having spacers are surrounded with oxide. The method further involves etching a portion of the polysilicon from a gate of the p-type transistor, depositing a low resistance material (e.g., Co, Ni, Ti, or other similar metals) on the n-type transistor and the p-type transistor, and heating the integrated circuit such that the deposited material reacts with the polysilicon of the n-type transistor and the polysilicon of the p-type transistor to form silicide. The silicide formed on the p-type polysilicon imposes compressive mechanical stresses along the longitudinal direction of the channel of the p-type transistor.

In a second aspect, this invention separately provides an integrated circuit, comprising a p-type transistor having a polysilicon layer and a material with a low-resistance thereon, an n-type transistor having a polysilicon layer and a material with a low-resistance thereon. A height of the polysilicon layer of the p-type transistor is less than a height of a polysilicon layer of the n-type transistor.

In another aspect, this invention separately provides a method for manufacturing an integrated circuit comprising a plurality of semiconductor devices including an n-type transistor and a p-type transistor. The method comprising forming a polysilicon layer on the n-type transistor and the p-type transistor, wherein the polysilicon layer on the p-type transistor has a shorter height than the polysilicon layer on the n-type transistor. A low-resistance material is deposited on the p-type transistor and the n-type transistor. The integrated circuit is heated such that the deposited low-resistance material reacts with the polysilicon of the p-type transistor and the polysilicon of the n-type transistor. In the methods, compressive mechanical stresses are formed along a longitudinal direction of a channel of the p-type transistor.

DETAILED DESCRIPTION

The invention provides a method for fabricating devices with improved performance characteristics. In one aspect of the invention, polysilicon is over-etched approximately half way down a gate stack structure of a PFET using a poly etch technique before silicidation of the PFET. The silicidation process of the over-etched polysilicon places the critical part of the silicon region under the gate oxide under compression. Thus, by over-etching the polysilicon of the PFET, according to the invention, the bending of the isolation is minimized and a compressive stress state is more directly relayed to the channel region. Generally, the invention uses over-etched polysilicon gates to create compressive stresses in the channels of the PFETs. By providing tensile stresses to the channel of the NFET and compressive stresses to the channel of the PFET the charge mobility and drive current along the channels of each device is enhanced.

By implementing the stresses using a polysilicon overetch, this invention provides the implementation of stresses which are self-aligned to the gate, whereas in the isolation induced stress structures, the stresses are not self-aligned to the gate. This invention also provides stress levels in the silicon under the gate which are much larger than the isolation-based or liner-based approaches.

In this invention, oxide fill is used to provide confinement to a gate stack. When the gates are confined laterally using oxide fill, the expansion of the silicide in the gate stack is relatively confined. Further, when a gate that is laterally surrounded with oxide fill is subjected to silicidation, the gate channel is put under tension. In particular, the gate channel is put under tension because silicide reacted thereon expands outwardly at the top. This results in compression in the top part of the isolation. At the same time, by inducing bending stresses at the bottom part of the isolation, next to the polysilicon under tension, the channel receives large tensile stresses. These stress levels are relatively high (on the order of 1–2 GPa) and these tensile stresses are beneficial to the NFET drive currents.

However, these tensile stresses significantly hinder the PFET drive currents. In this invention, the stresses in the PFET are reduced and/or made to be compressive stresses rather than tensile stresses in order to improve the performance of the PFET. Thus, this invention provides a method for providing longitudinal compressive stresses along the channel of the PFET while providing tensile stresses along the channel of the NFET to improve the performance of the devices.

Figure 1:
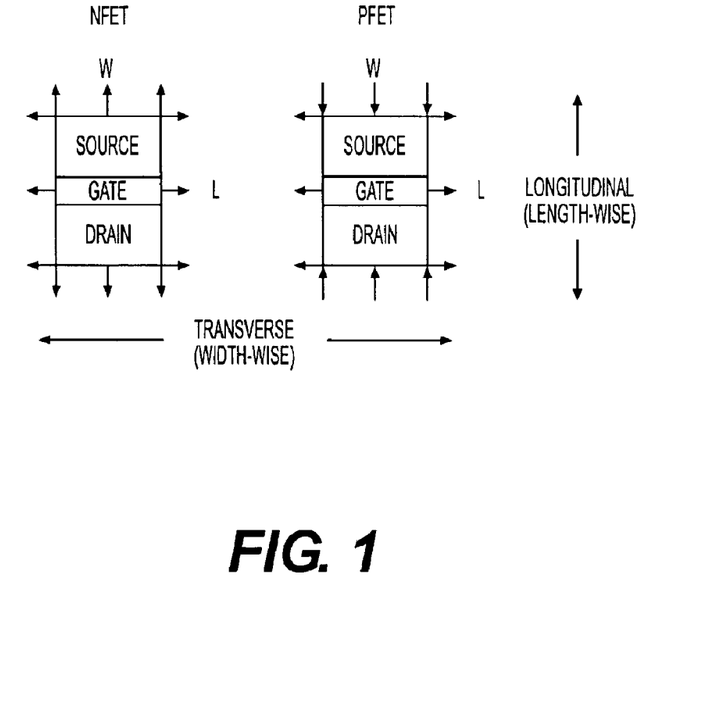
FIG. 1 depicts desired stress states for PFETs and NFETs.

FIG. 1 illustrates desired stress states for improving the performance of PFETs and NFETs (see Wang et al., IEEE Tran. Electron Dev., v.50, p.529, 2003). In FIG. 1, an NFET and a PFET are shown to have a source region, a gate region and a drain region. The NFET and PFET are shown to have arrows extending outward from the active area to illustrate tensile stresses. The arrows extending inward toward the PFET device are illustrative of compressive forces. More specifically, the outwardly extending arrows, shown extending from the NFET, illustrate a tensile stress that is desired in the transverse and longitudinal directions of the device. Similarly, the inwardly extending arrows, shown with relation to the PFET, illustrate a desired longitudinal compressive stress. The range of stresses needed to influence device drive currents is of the order of a few hundred MPa to a few GPa. The width and the length of the active area of each device are represented by "W" and "L", respectively. It should be understood that each of the longitudinal or transverse stress components could be individually tailored to provide the performance enhancements for both devices (i.e., the NFET and the PFET).

Figure 2A:
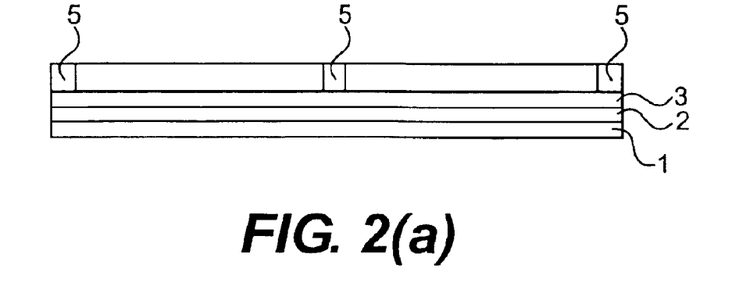
FIGS. 2(a) through 2(h) depict an exemplary process for forming the MOSFETs according to the invention.

FIGS. 2(a) through 2(h) depict a general exemplary process for forming the MOSFETs according to this invention. FIGS. 2(a) through 2(d) explain processes that are known and thus, any known applicable process may be used. FIG. 2(a) illustrates the structure after the shallow trenches 5 (STI) are formed. An SOI (silicon-on-insulator) wafer which has a stack of silicon 1, buried oxide 2, and a silicon layer 3 is used. Generally, to form the STI on SOI wafers, a thin (~50 Å) layer of silicon dioxide $SiO_2$ (pad oxide) (not shown) is grown on the silicon layer 3, which is on the buried oxide layer 2 on the silicon substrate 1, by reacting silicon and oxygen at high temperatures. A thin layer (about 1000 Å to about 2500 Å) of pad silicon nitride ($Si_3N_4$) (not shown) is then deposited using chemical vapor deposition (CVD). Next, the patterned photoresist with a thickness of about 0.1 microns to about 1.0 microns is deposited, and the structure is exposed and developed to define the trench areas 5. Next, the exposed $SiO_2$ and the $Si_3N_4$ are etched using reactive ion etching (RIE). Next, an oxygen plasma is used to burn off the photoresist layer. A wet etch is used to remove the pad $Si_3N_4$ and pad oxide. Then an oxide layer is deposited to fill the trenches and the surface oxide is removed using chemical mechanical polishing (CMP). This completes the formation of STI as seen in FIG. 2(a).

Figure 2B:
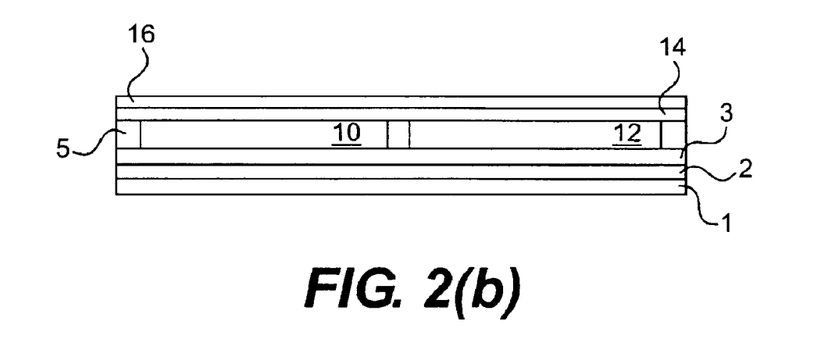

Next, a sacrificial oxide (not shown) of about 50 Å is grown on the silicon. Then, as shown in FIG. 2(b) an n-well 10 and a p-well 12 are formed. Patterned photoresist layers may be used to successively form the n-well 10 (using, for example, multiple implants of Phosphorous ions) and the p-well 12 (using, for example, multiple implants of Boron ions). The well implants are then optionally annealed. The sacrificial oxide layer is then removed using a wet HF solution, such that a clean silicon surface is left behind.

Next, as shown in FIG. 2(b), a gate oxide layer 14 of about 10 Å to about 100 Å is grown. On the gate oxide layer 14, a polysilicon layer 16 is deposited using CVD to a thickness of about 500 Å to about 1500 Å to form the gate electrodes 18 and 20 shown in FIG. 2(c). Patterned photoresist layers (not shown) are used to define the gate electrodes. RIE is used to etch the exposed portions of the polysilicon layer 16 and the photoresist patterns are stripped away in order to complete formation of the gate stack of the n-type transistor 17 and the gate stack of the p-type transistor 19.

Figure 2C:
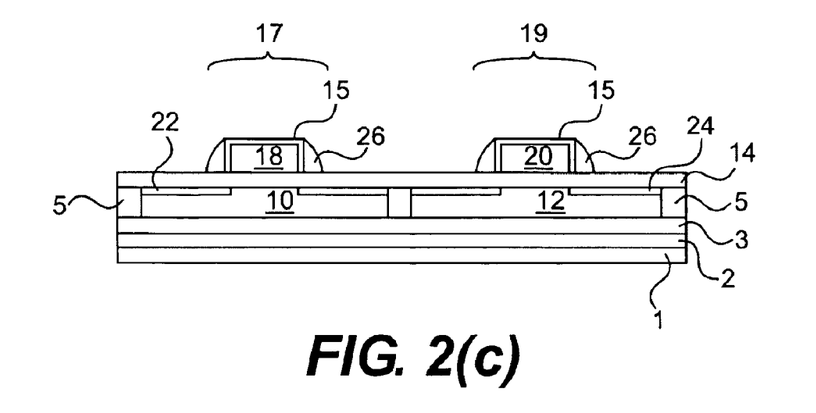

FIG. 2(c) shows the formed gate electrodes 18 and 20. A thin layer of oxide 15 is then grown on the remaining polysilicon. Patterned photoresist layers (not shown), which are later removed, are used to successively tip (and halo countering doping implants) implant the n-type and p-type transistors. For n-type transistors, a very shallow and low dose implant of arsenic ions, for example, may be used to form the p-tip 22 (while a Boron implant, for example, may be used for halos). For p-type transistors, a very shallow and low dose implant of $BF_2$ ions, for example, may be used to form n-tip 24 (while an arsenic implant may, for example, be used for halos).

Figure 2D:
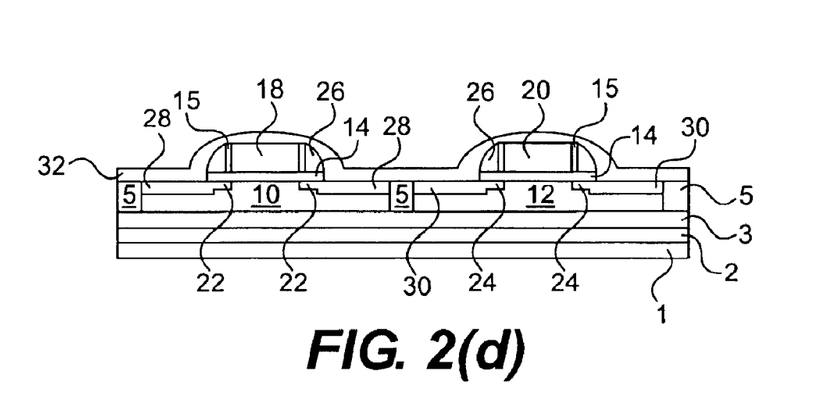

Next, as shown in FIG. 2(c), spacers 26 are formed by depositing a silicon nitride layer (not shown) using CVD to a thickness of about 100 Å to about 1000 Å and then etching the nitride from the regions other than the sidewalls of the gate. Patterned photoresist layers (not shown), which are removed prior to the next stage of the process, are used to successively create the source/drain regions of the transistors. In FIG. 2(d), for the n-type transistors, a shallow and high-dose of arsenic ions, for example, may be used to form the source/drain regions 28 while the p-type transistors are covered with the corresponding photoresist layer. For the p-type transistors, a shallow and high dose of $BF_2$ ions, for example, may be used to form the source/drain regions 30 while the n-type transistors are covered with the corresponding photoresist layer. An anneal is then used to activate the implants. The exposed oxide on the structure is then stripped by dipping the structure in HF in order to expose bare silicon in the source, gate and drain regions of the transistors.

Still referring to FIG. 2(d), metal 32 is deposited to a thickness of about 30 Å to about 200 Å across the wafer surface in order to form silicide. The silicide could be formed from reacting the underlying with any deposited metal such as Co, Hf, Mo, Ni, Pd2, Pt, Ta, Ti, W, and Zr. In the regions, such as, the source, drain and gate regions, where the deposited metal is in contact with silicon, the deposited metal reacts with the silicon to form silicide. In the other regions (i.e., where the deposited metal is not in contact with silicon), the deposited metal remains unchanged. This process aligns the silicide to the exposed silicon and is called "self-aligned silicide" or salicide. The unreacted metal is then removed using a wet etch while the formed silicide 34 remains, as shown in FIG. 2(e).

Figure 2E:
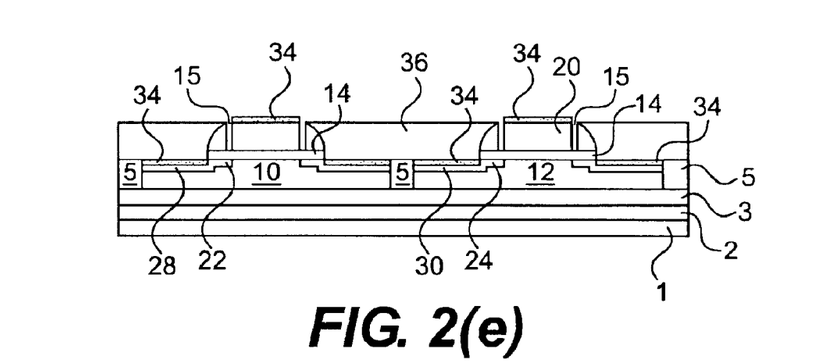
Figure 2F:
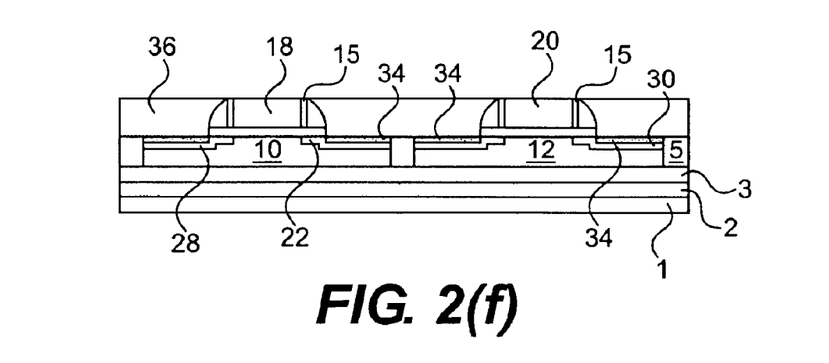
Figure 2G:
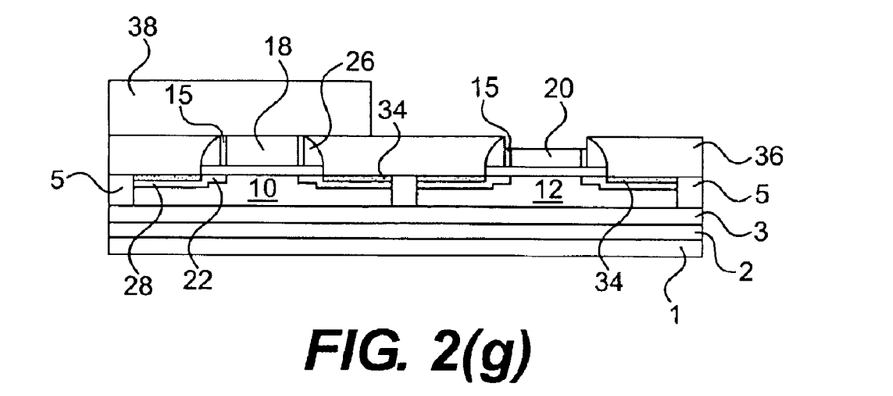
Figure 2H:
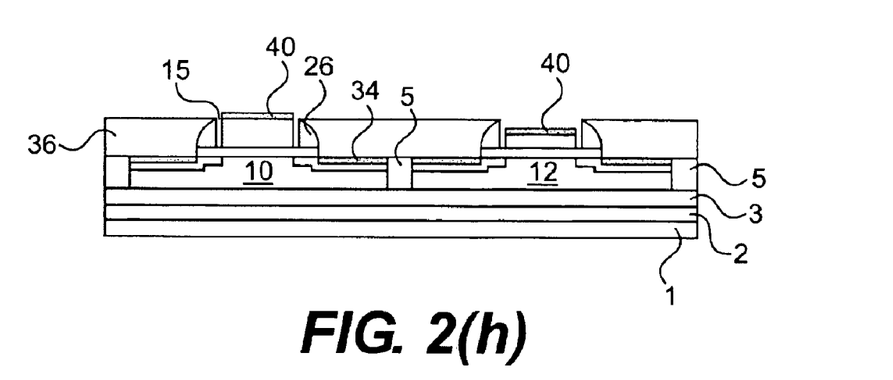

In methods according to the invention, as shown in FIG. 2(e), an oxide fill 36 followed by chemical mechanical polishing is used to planarize the surface. Next, as shown in FIG. 2(f), the silicide 34 on top of the polysilicon is removed using a selective etch. Then, as shown in FIG. 2(g), the n-type device of the structure is covered with a mask 38. The mask may be, for example, photoresist material. Next, the polysilicon of the p-type device is partially etched about half-way down the gate stack. The ratio of the height of the polysilicon of the n-type device to the height of the polysilicon of the p-type device may be 2:1. More particularly, gate height stacks are generally between about 500 Å to about 1500 Å. In this case, the p-type gate polysilicon is etched down to about 250 Å to about 750 Å. Standard wet or dry etch known in the art for polysilicon or doped polysilicon may be used. As shown in FIG. 2(h) after partially etching the polysilicon of the p-type device, the height of the polysilicon of the p-type device is shorter than the height of the polysilicon of the n-type device.

After removing the mask 38 over the n-type device, a metal or low resistance material 40, such as, for example, Co, HF, Mo, Ni, Pd$_2$, Pt, Ta, Ti, W, and Zr is deposited over the wafer via, for example, evaporation, sputtering, or CVD techniques. In particular, Ni, for example, may be deposited over the polysilicon of the n-type and p-type devices and reacted to form silicide at different heights of the stack for the n-type and p-type devices, respectively.

Next, the structure is heated to temperature of about 300° C. to about 1000° C. to allow the deposited silicide material to react with the polysilicon. During sintering, silicide only forms in the regions where metal is in direct contact with silicon or polysilicon. After the reaction, the silicide thickness can be anywhere from about 50 Å to about 500 Å, depending on the initial metal thickness and temperature and time of the anneal. The remaining unreacted silicide forming material is then removed, for example, with a selective etch without damaging the formed silicide. The remaining formed silicide is automatically self-aligned with the gate of the MOS device. As shown in FIG. 2(g), the height of the silicide material on the p-type transistor is greater than a height of the silicide material on the n-type transistor. After this, the standard middle of the line (e.g., passivation and contact formation) and back end of the line (various interconnect metal, via, and interlevel dielectrics) processes are performed.

In another embodiment of the invention, silicide forming material may be deposited over the gate 18 of the n-type device and the gate 20 of the p-type device. For example, silicide forming material may be deposited to a height of about 70 Å to about 200 Å. Next, chemical/mechanical polishing may be performed to polish into a planar surface the formed silicide. It should be understood by those of skill in the art that it is also possible to use co-evaporation, co-sputtering, or sputtering to simultaneously deposit both silicon and metal onto the polysilicon surface. After this, the standard middle of the line (e.g., passivation and contact formation) and back end of the line (various interconnect metal, via, and interlevel dielectrics) processes are performed.

It should be understood that this invention is readily applicable to bulk or layered SiGe substrates. It should also be understood that this invention may also be used with damascene gate structures, which have been proposed for use of high k dielectric gate oxides.

Figure 3:
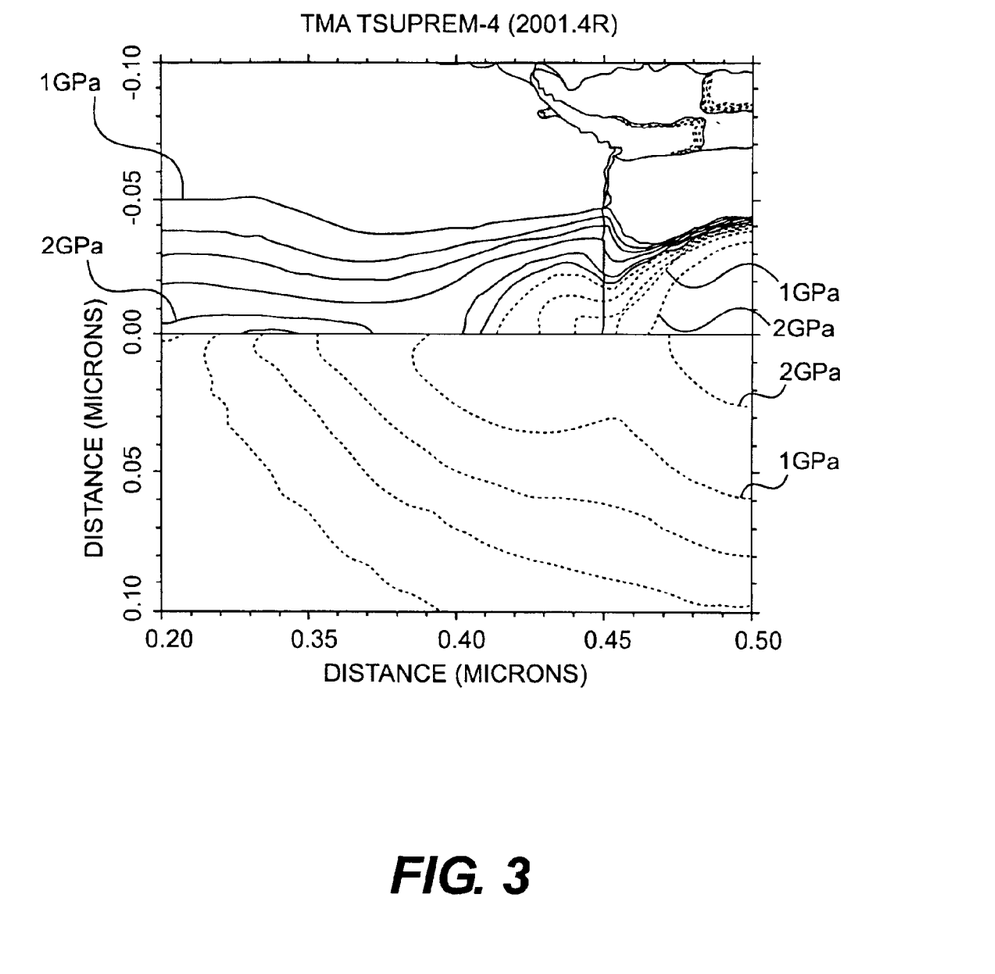
FIG. 3 depicts stresses in a gate structure with a full poly height according to the invention.

FIG. 3 shows the stresses in the gate structure when full poly height is used for the PFET. The dashed lines represent tensile stress and the solid lines represent compressive stress. As can be seen from FIG. 3, with full poly stack height, in the channel area of the PFET, only tensile stress is shown.

Figure 4:
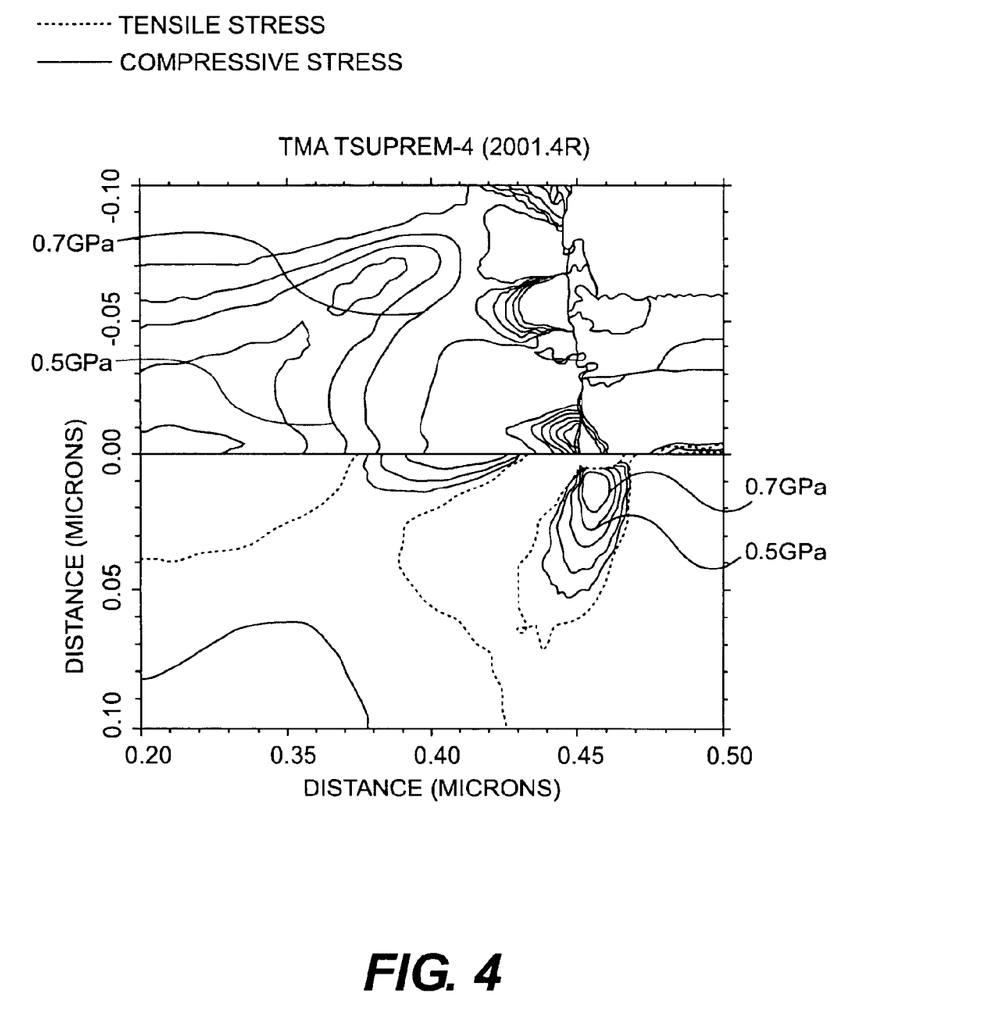
FIG. 4 depicts stresses in a gate structure with an etched poly stack according to the invention.

FIG. 4 shows the stresses in the gate structure when an etched poly stack is used for the PFET in accordance with this invention. Similar to FIG. 3, the dashed lines represent the tensile stress and the solid lines represent the compressive stress. As can be seen from FIG. 4, with an etched poly stack for the PFET, in the channel area below the gate, there is primarily compressive stress. As discussed above with regards to FIG. 1, in PFETs, a longitudinal compressive stress is desired. The typical range for the desired compressive/tensile stresses is on the order of a few hundred MPa to a few GPa. The invention can produce very high compressive stresses and tensile stresses in the channels of the PFET and NFET devices, respectively. By providing tensile stresses to the channel of the NFET and compressive stresses to the channel of the PFET the charge mobility along the channels of each device is enhanced. Thus, as described above, the invention provides a method providing compressive stresses along the longitudinal direction of the channel by over-etching the polysilicon of the PFET prior to silicidation.

While the invention has been described in terms of embodiments, those skilled in the art will recognize that the invention can be practiced with modification within the spirit and scope of the appended claims.

What is claimed is:

1. A method for manufacturing an integrated circuit comprising a plurality of semiconductor devices including an n-type transistor and a p-type transistor having a polysilicon gate, the method comprising:
    depositing oxide fill on the n-type transistor and the p-type transistor and chemical/mechanical polishing the deposited oxide fill such that a gate stack of the n-type transistor and a gate stack of the p-type transistor, the n-type transistor and the p-type transistor each having spacers are surrounded with oxide;
    etching a portion of the polysilicon from the gate of the p-type transistor;
    depositing a low-resistance material on the p-type transistor and the n-type transistor; and
    heating the integrated circuit such that the deposited low-resistance material reacts with the polysilicon of the p-type transistor and the polysilicon of the n-type transistor, such that compressive mechanical stresses are formed along a longitudinal direction of a channel of the p-type transistor.

2. The method of claim 1, further comprising removing a portion of the deposited low resistance material.

3. The method of claim 2, wherein the step of removing comprises removing a portion of the deposited low-resistance material with a selective etching technique.

4. The method of claim 1, further comprising:
    covering an n-type transistor with a mask prior to performing the step of etching; and
    removing the mask after performing the step of etching.

5. The method of claim 4, wherein the mask is a patterned photoresist layer.

6. The method of claim 1, wherein the step of depositing comprises depositing at least one of Co, Hf, Mo, Ni, Pd$_2$, Pt, Ta, Ti, W, and Zr on the p-type transistor and then n-type transistor.

7. The method of claim 1, wherein the step of heating comprises heating the integrated circuit to a temperature of about 300° C. to about 1000° C.

8. The method of claim 1, wherein the step of depositing a low-resistance material comprises depositing a low-resistance material to a height of approximately 30 Å–200 Å.

9. The method of claim 1, wherein the step of etching a portion of the polysilicon comprises etching about half of the polysilicon from the p-type transistor.

10. The method of claim 1, wherein the step of etching comprises etching the polysilicon from the gate of the p-type transistor such that a n-type polysilicon to p-type polysilicon ratio is about 2:1.

11. The method of claim 1, wherein the etching comprises etching about 250 to about 750 Å of the p-type polysilicon.

12. The method of claim 1, wherein the step of etching comprises etching the polysilicon from the gate of the p-type transistor using a wet etch or a dry etch.

13. The method of claim 1, wherein the step of depositing a low-resistance material comprises depositing a low resistance material on the p-type transistor and the n-type transistor using evaporation, sputtering or chemical vapor deposition techniques.

14. A method for manufacturing an integrated circuit comprising a plurality of semiconductor devices including an n-type transistor and a p-type transistor, the method comprising:

forming a polysilicon layer on the n-type transistor and the p-type transistor, wherein the polysilicon layer on the p-type transistor has a shorter height than the polysilicon layer on the n-type transistor;

depositing a low-resistance material on the p-type transistor and the n-type transistor; and heating the integrated circuit such that the deposited low-resistance material reacts with the polysilicon of the p-type transistor and the polysilicon of the n-type transistor, such that compressive mechanical stresses are formed along a longitudinal direction of a channel of the p-type transistor.

* * * * *